United States Patent
Morikawa et al.

(10) Patent No.: US 6,707,102 B2
(45) Date of Patent: Mar. 16, 2004

(54) SEMICONDUCTOR DEVICE INCLUDING AN INSULATED GATE TYPE FIELD EFFECT TRANSISTOR AND METHOD FOR FABRICATING THE SAME

(75) Inventors: Masatoshi Morikawa, Hanno (JP); Mio Shindo, Kokubunji (JP); Isao Yoshida, Hinode (JP); Kenichi Nagura, Moroyama (JP)

(73) Assignee: Renesas Technology Corp., Tokyo (JP)

(*) Notice: Subject to any disclaimer, the term of this patent is extended or adjusted under 35 U.S.C. 154(b) by 113 days.

(21) Appl. No.: 09/929,016

(22) Filed: Aug. 15, 2001

(65) Prior Publication Data

US 2002/0033508 A1 Mar. 21, 2002

(30) Foreign Application Priority Data

Sep. 19, 2000 (JP) .......................................... 2000-283168

(51) Int. Cl.$^7$ .............................................. H01L 29/76
(52) U.S. Cl. ........................ 257/340; 257/409; 257/328; 438/197; 438/267
(58) Field of Search ................................ 257/340, 249, 257/329, 333, 335, 409, 488, 487, 491, 508, 328; 438/197, 267, 299, 454

(56) References Cited

U.S. PATENT DOCUMENTS

| | | | | |
|---|---|---|---|---|
| 5,821,144 A | * | 10/1998 | D'Anna et al. | 438/276 |
| 5,841,166 A | * | 11/1998 | D'Anna et al. | 257/335 |
| 5,869,875 A | * | 2/1999 | Hebert | 257/382 |
| 5,912,490 A | * | 6/1999 | Hebert et al. | 257/340 |
| 5,918,137 A | | 6/1999 | Ng et al. | |
| 6,001,710 A | * | 12/1999 | Francois et al. | 438/454 |
| 6,091,110 A | * | 7/2000 | Hebert et al. | 257/340 |
| 6,215,152 B1 | * | 4/2001 | Hebert | 257/340 |
| 6,492,678 B1 | * | 12/2002 | Hebert | 257/331 |
| 6,521,923 B1 | * | 2/2003 | D'Anna et al. | 257/288 |

OTHER PUBLICATIONS

Christopher P. Dragon, Wayne R. Burger, Bob Davidson, Enver Krvavac, Nagaraj Dixit and Jale Joersz, "High Power RF–DSMOS Transistors for Wireless Communication Base Station Applications," MEW '99 Microwave Workshop Digest, pp. 289–294.

Naoto Shigemoto, Yuzo Yoneyama, Yoshihiro Unno, Toshihiro Hayata and Shuzo Yanagi, "W–CDMA Wide–band–CDMA Base Station System," Mobile Communications Systems Division, NEC, vol. 51, No. 7, 1998, pp. 9–15.

Alan Wood, Chris Dragon and Wayne Burger, High Performance Silicon LDMOS Technology for 2GHz RF Power Amplifier Applications, 1996 IEEE, pp. 87–90.

* cited by examiner

*Primary Examiner*—Tom Thomas
*Assistant Examiner*—José R. Diaz
(74) *Attorney, Agent, or Firm*—Reed Smith LLP; Stanley P. Fisher, Esq.; Juan Carlos A. Marquez, Esq.

(57) ABSTRACT

A power MOSFET for a high frequency amplification element having good output power characteristics and high frequency characteristics is described. In the power MOSFET, a shield conductive film electrically connected to via an insulating film is arranged over a drain-offset semiconductor region. A wiring for a drain electrode is so arranged as to extent in parallel to the shield conductive film at one end side of the shield conductive film. On the other hand, a wiring for the gate electrode, a wiring for a source electrode and a gate shunt wiring are arranged in this order to extend in parallel to each other at the other end side of the shield conductive film. The shield conductive film is so formed that the thickness thereof is smaller than that of the wiring for the gate electrode. In this way, the input and output capacitances of the MOSFET can be decreased.

10 Claims, 16 Drawing Sheets

SEMICONDUCTOR DEVICE INCLUDING AN INSULATED GATE TYPE FIELD EFFECT TRANSISTOR AND METHOD FOR FABRICATING THE SAME

BACKGROUND OF THE INVENTION

This invention relates to a semiconductor device adapted for use in mobile communication devices using a microwave band ranging from 800 MHz to 2.5 GHz, such as cellular phone systems, and more particularly, to a technique effective for application to an amplifier element of a high frequency power amplifier outputting high frequency signals after amplification of power.

In recent years, mobile communication devices, or so-called portable telephones, typical of which are communication systems including a GSM (Global System for Mobile Communication) system, a PCS (Personal Communication Systems), a PDC (Personal Digital Cellular) system, a W-CDMA (Code Division Multiple Access) system and the like, have rapidly, globally been in wide use. It has thus become important how the high performance, miniaturization and high reliability of base station systems therefor are realized. The arrangements of these mobile communication station systems are, for example, set out in "NEC Technical Report" vol. 51, No. 7 (1998), pp. 9–15.

One of main constituting components of the base station system includes a high frequency power amplifier for transmitting high frequency signals to an antenna. The amplification element used in the amplifier is made of a bipolar transistor and an insulated gate type field effect transistor (hereinafter referred to simply as MOSFET), each using a silicon (Si) substrate, and a transistor using a compound semiconductor substrate, typical of which is GaAs. Especially, the MOSFET using a silicon substrate is now predominantly employed as the amplification element because of its advantages that a high breakdown voltage is so easy that high power can be conveniently established, that MOSFET is thermally stable and is thus highly reliable, and that a circuit arrangement becomes simple because of the drive by voltage.

As for the MOSFET for the amplification element, a first prior art technique is known as set out, for example, in IEDM Technical Digest. 1996, pp. 87–90 and Microwave Workshop and Exhibition (MWE) Digest, 1999, pp. 289–294. The MOSFET set forth in these references has such an LDMOS (Lateral Diffusion MOS) structure, in which a p-type impurity is diffused from a source side of a gate electrode, for the purposes of preventing punch-through and controlling a threshold voltage, and is provided with an offset structure between the gate electrode and the drain electrode for ensuring a high breakdown voltage. In addition, a source electrode is formed so as to cover the gate electrode therewith, thereby reducing the capacitance between the gate electrode and the drain electrode (Cgd: feedback capacitance). This is called Faraday-shield.

In the above prior art technique, in order to obtain high output power of 100 W or over, MOSFET is so arranged that gate length=0.6 $\mu$m, gate oxide film thickness=40 nm and gate width=approximately 100 to 400 nm. With the MOSFET having such a size as mentioned above, the input and output capacitances range from several tens to several hundreds of pF, so that input and output impedances at a working frequency of 2 GHz is as small as approximately 1$\Omega$. When the MOSFET in this state is assembled in a package and an attempt is made to impedance conversion to 50$\Omega$ at an external matching circuit, the conversion ratio is so great as to lead to a loss at a transmission line and a band reduction. Accordingly, the impedance is improved by arranging the matching circuit from a MOS capacitance chip inside a package located as closely to FET as possible and an inductance depending on a wire.

With respect to a further improvement in performance of MOSFET for the amplification element, a second prior art technique is known as set out in U.S. Pat. No. 5,918,137 of Ng et al. In this prior art technique, in order to improve the high frequency performance and reliability of MOSFET, a shield conductive film made of the same type of material as used for a gate electrode is formed on an insulating film between the gate electrode and the drain electrode.

At least a part of the insulating film and the shield conductive film are, respectively, formed according to the same step as a gate insulating film and the gate electrode of the MOSFET, thus being not complicated in process. Because the gate electrode and the shield conductive film are self-alignedly arranged, the variation of electric characteristics can be suppressed. This MOSFET structure ensures the reduction in capacitance between the gate electrode and the drain electrode (Cgd) when the shield conductive film is set at the same potential as a source, enabling one to improve the power gain in high frequency operations. In addition, the electric field in the substrate surface at the end of the gate electrode can be limited, making it possible to improve a drain breakdown voltage and suppress characteristic degradation ascribed to hot electron injection.

SUMMARY OF THE INVENTION

According to our investigations, the first and second prior art techniques have the following problems, respectively.

The MOSFET structure in the first prior art technique has the source electrode, with which the gate electrode is covered, formed on a thick interlayer insulating film, so that the portion between the side wall of the gate electrode and the drain electrode cannot be shielded and the effect of limiting the electric field against the substrate is small. Thus, satisfactory effects on the reduction in capacitance between the gate electrode and the drain electrode (Cgd), the improvement in drain breakdown voltage and the suppression of degradation caused by hot electrons cannot be obtained.

Although the MOSFET structure in the second prior art technique takes into account the reduction in electrostatic capacitance (Cgd) between the gate electrode and a drain semiconductor region (or drain electrode), capacitances between other wirings are not taken into consideration. More particularly, the shield conductive film and the gate electrode are formed in the same step, under which the thickness of the shield conductive film is determined depending on the requirement for the gate electrode, so that the capacitance (Cgs) between the shield conductive film and the side wall of the gate electrode cannot be freely made small.

Likewise, with respect to the capacitance between the drain electrode and the shield conductive film (Cds) determined on the thickness of the shield conductive film, the drain electrode is made thicker than the shield conductive film because of the necessity in current capacity. Accordingly, it is not possible to reduce the capacitance by freely decreasing the thickness of the shield conductive film. Moreover, the thickness of the insulating film provided beneath the shield conductive film is thin, like the gate insulating film, so that the electrostatic capacitance between the shield conductive film and the drain-offset semiconductor region appears to be great, thereby increasing the capacitance between the drain and the source. Additionally, when using a structure provided with a gate shunt wiring on the gate electrode for the purpose of reducing the gate resistance, an electrostatic capacitance is established between the shield conductive film and the gate shunt wiring, with the result that the capacitance between the gate electrode and the source increases over the case where no shield conductive film exists.

All the capacitances stated hereinabove are added to the input and output capacitances (Cgs, Cds) of the MOSFET. These lower the input and output impedances of the MOSFET in high frequency operations, so that if a matching circuit is provided in a package, a loss in the matching circuit becomes significant, with the attendant problem that output power and an efficiency are lowered. Moreover, the conversion ratio of the impedance becomes great, thus being inconvenient from the standpoint of design margins such as of a frequency band and a packaging area. The increase of the input capacitance (Cgs) has the problem that the frequency cut-off of a MOS transistor is lowered and the high frequency power gain is lowered.

On the other hand, where the gate shunt wiring is not used by arranging the gate electrode that has a double structure (or a polyside structure) of polysilicon and tungsten silicide to reduce the resistance, the parasitic capacitance between the gate electrode and the shield conductive film can be reduced, but the resistance of the gate electrode is not appreciably small, so that limitation is placed on the width (i.e. a finger width) of the gate electrode. Thus, there arises the problem that the freedom of a layout of MOSFET is lost, thereby increasing the parasitic resistance or capacitance.

An object of the invention is to provide a semiconductor device wherein the increase in input and output capacitances of MOSFET is minimized, and the feedback capacitance ascribed to a shield conductive film is reduced, a drain breakdown voltage and a current capacitance are improved through limitation of an electric field and hot-electron degradation can be suppressed without increasing a loss at an impedance matching circuit.

Another object of the invention is to provide a semiconductor device wherein the resistance of a gate electrode of MOSFET can be reduced to a full extent and the effect of a shield conductive film is brought about thereby ensuring both an improvement in output power and efficiency in high frequency, great power operations and reliability.

The above and other objects and novel features of the invention will become apparent from the description of the specification with reference to the accompanying drawings.

Typical embodiments of the invention are briefly described below.

The MOSFET of the invention comprises a gate electrode formed over a gate insulating film, a source semiconductor region, a drain semiconductor region kept away from the gate electrode, a drain-offset semiconductor region formed between the gate electrode and the drain semiconductor region, and a shield conductive film formed over the drain-offset semiconductor region and electrically connected to the source semiconductor region, wherein the shield conductive film has a thickness smaller than the gate electrode.

Preferably, the MOSFET of the invention further comprises a gate insulating film and a first insulating film provide between the drain-offset semiconductor region and the shield conductive film formed thereover.

Preferably, the MOSFET of the invention is arranged such that in at least a portion of a planar layout thereof, the drain electrode, the shield conductive film, the gate electrode, the source electrode and the gate shunt wiring are arranged in this order. Moreover, these portions extend in parallel to one another.

The provision of the shield conductive film between the gate electrode and the drain electrode of the MOSFET acts to reduce the capacitance between the gate electrode and the drain-offset semiconductor region and also to limit the electric field in the drain region (the region including the drain-offset) at the end portion of the gate electrode.

To arrange the shield conductive film not to be superposed with the gate electrode in a planar pattern and to make the thickness of the shield conductive film smaller than that of the gate electrode serve to suppress an increase in capacitance between the electrodes to a minimum by arranging the shield conductive film.

Moreover, to make the thickness of the insulating film beneath the shield conductive film smaller than that of the gate insulating film acts to suppress the capacitance between the shield conductive film and the drain-offset semiconductor region to a minimum.

The shunt of the gate electrode with a wiring (i.e. a gate shunt wiring) acts to suppress the lowering of a power gain in a high-frequency wave by reduction of the gate resistance.

BRIEF DESCRIPTION OF THE ACCOMPANYING DRAWINGS

Figure 18:
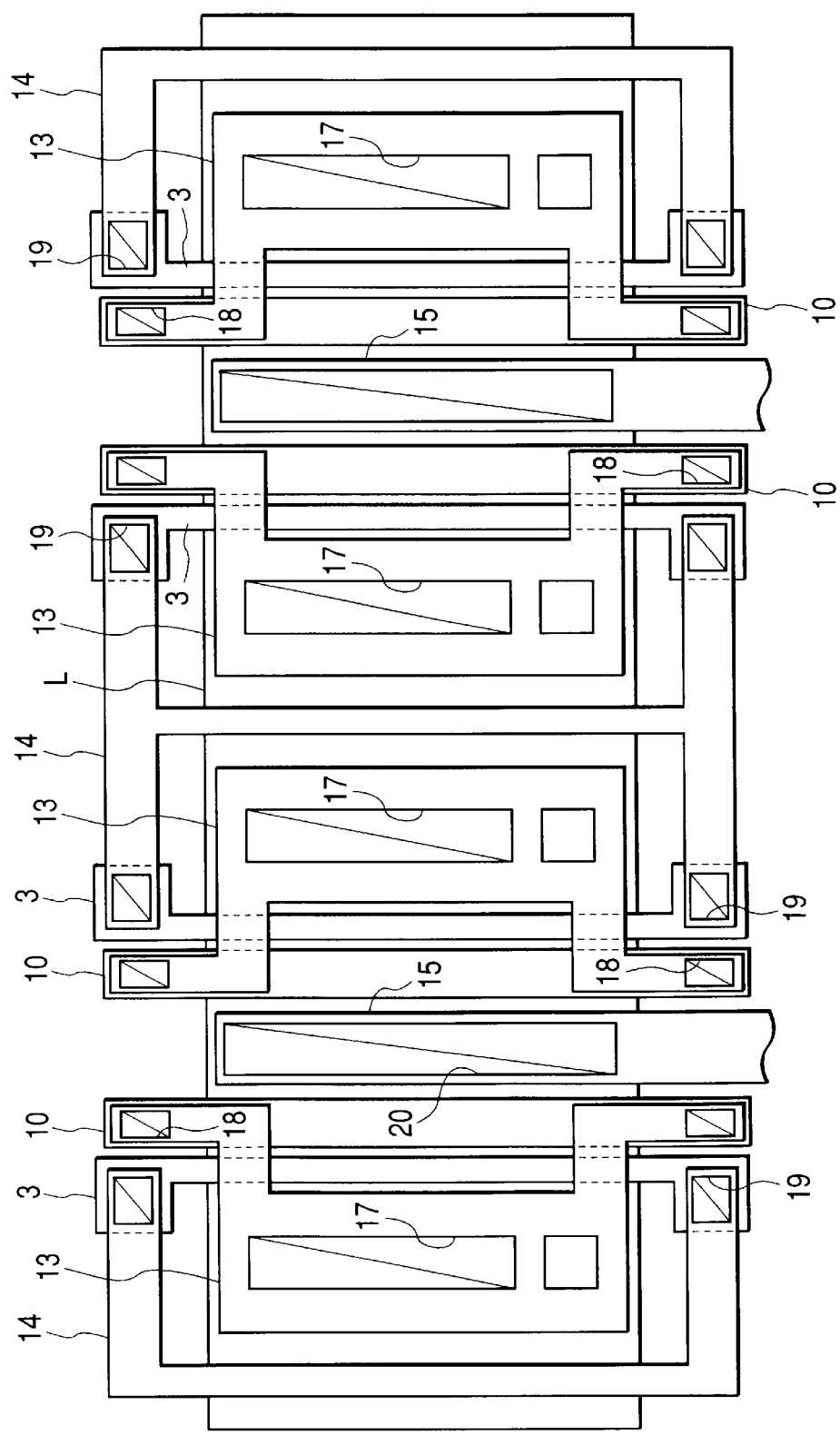
Figure 19:
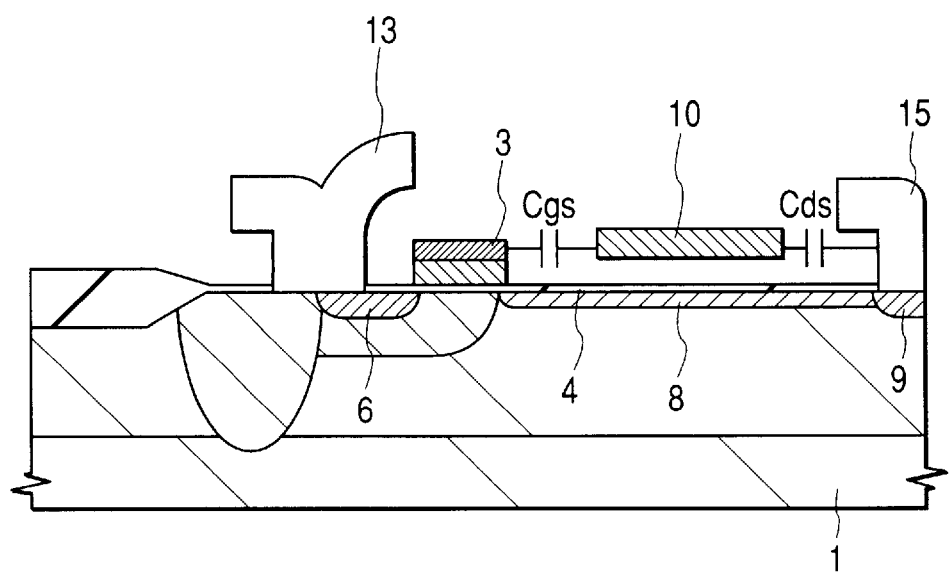

FIG. 18 is a sectional view of an essential part showing another step in the method for fabricating power MOSFET according to the embodiment of the invention; and FIG. 19 is an illustrative view of the capacitance between a shield conductive film and a gate electrode and the capacitance between the shield conductive film and a drain electrode in power MOSFET according to an embodiment of the invention.

DETAILED DESCRIPTION OF THE INVENTION

Embodiments of the invention is more particularly described with reference to the accompanying drawings. It will be noted that like reference numerals indicate like members or parts throughout the accompanying drawings illustrating the embodiments of the invention and are not repeatedly illustrated.

Figure 1:
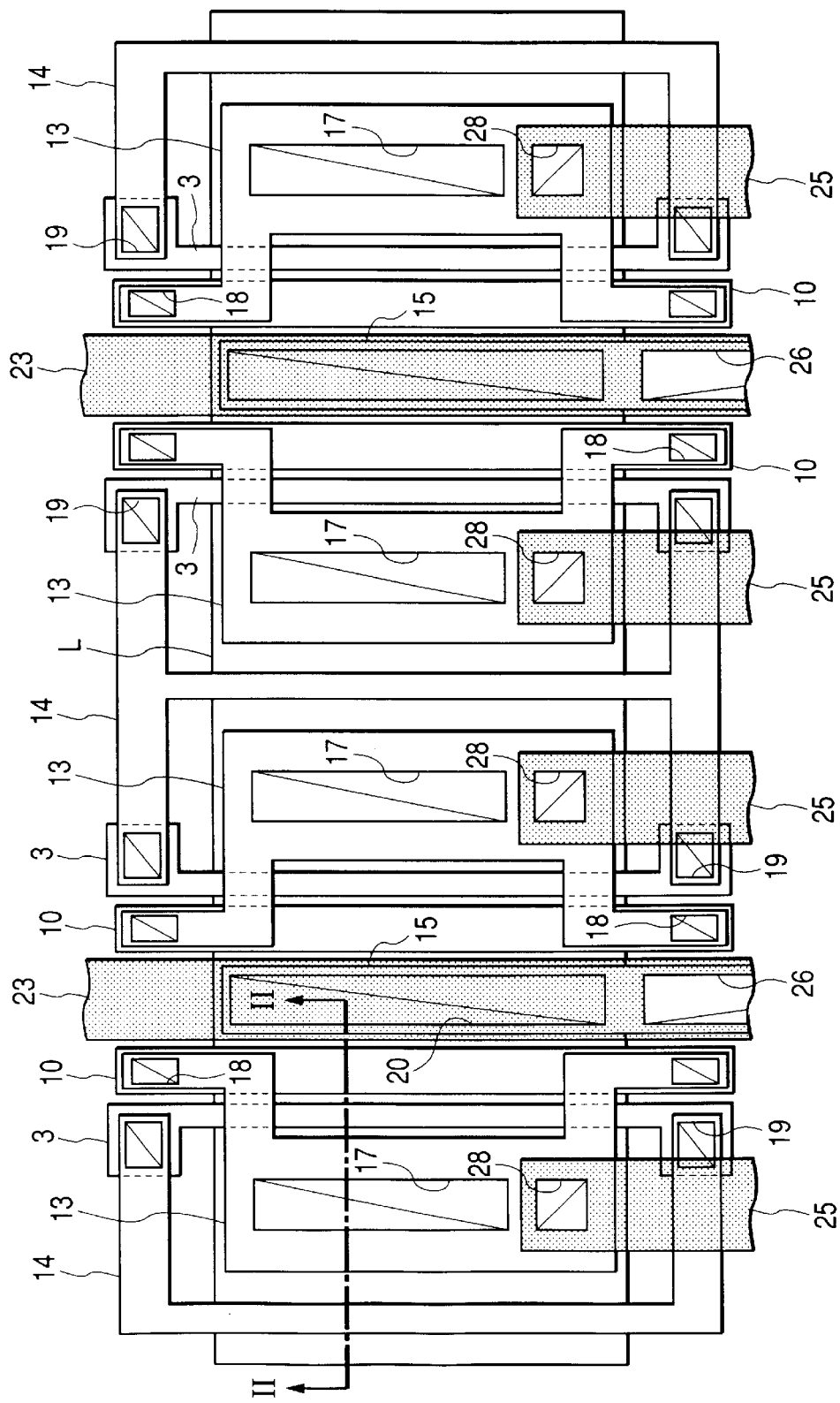
FIG. 1 is a plan view showing part of a cell portion where power MOSFET is formed according to an embodiment of the invention.
Figure 2:
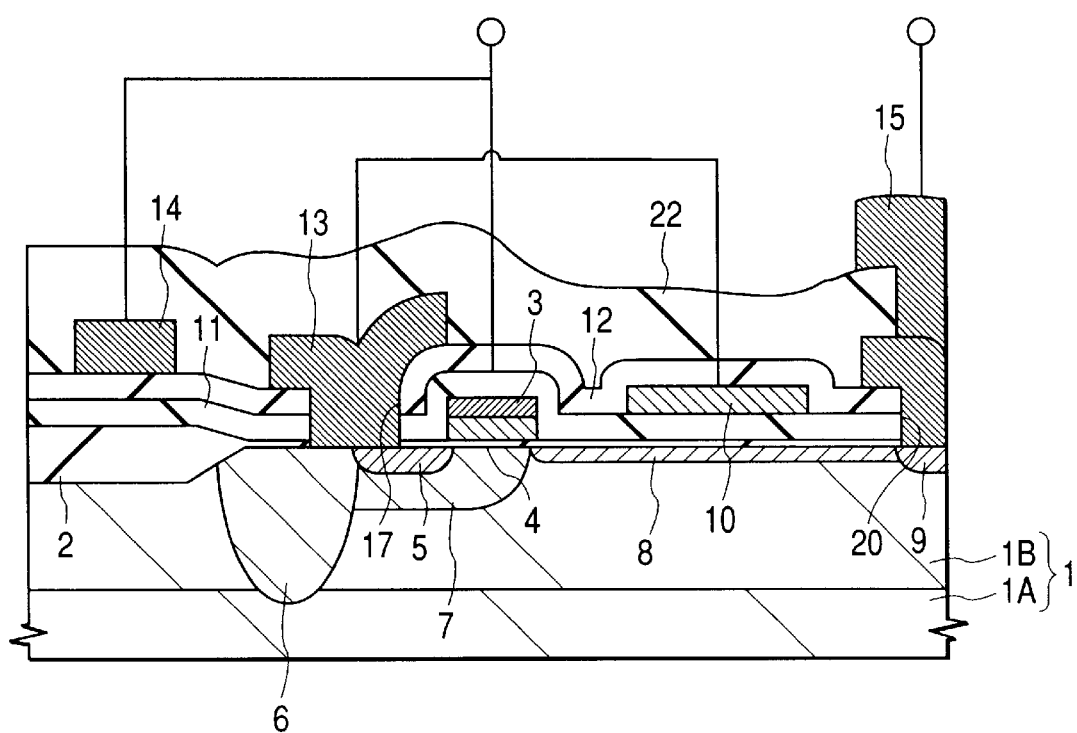
FIG. 2 is a sectional view taken along line II—II of FIG. 1.
Figure 3:
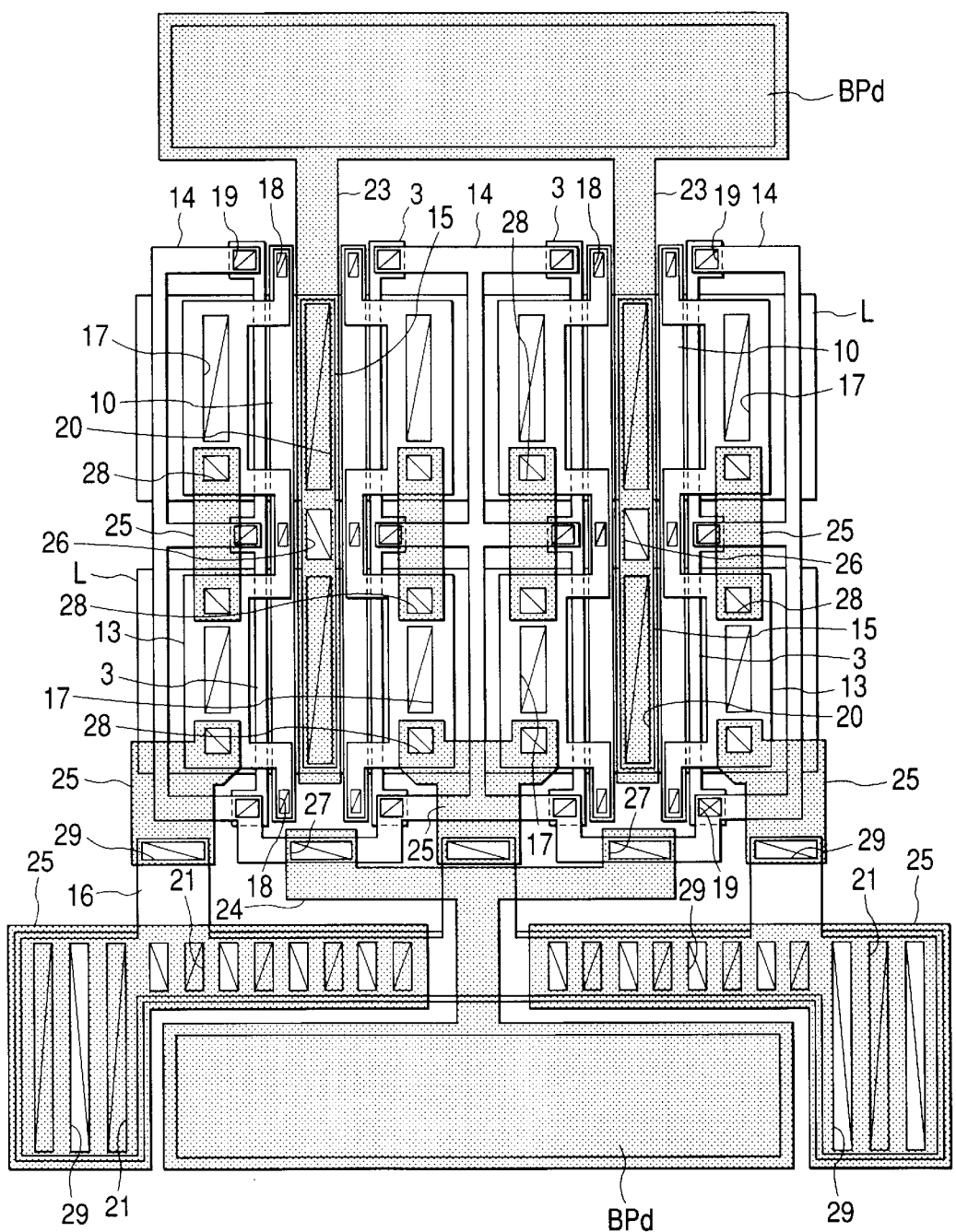
FIG. 3 is a view showing a layout of an entire chip where power MOSFET is formed according to the embodiment of the invention.

FIG. 1 is a plan view showing a region wherein four cell portions, in which power MOSFET for high frequency is formed in each portion, are combined (i.e. a region having four MOSFET's) in accordance with an embodiment of the invention, FIG. 2 is a sectional view of a region having one MOSFET, taken along line II—II of FIG. 1, and FIG. 3 is a view showing an entire layout of a chip.

The MOSFET of this embodiment is formed on a main surface of a silicon substrate 1 made of a support substrate 1A, which is made of low resistance p-type single crystal silicon and having a specific resistance of 10 Ωcm or below, and a high resistance epitaxial layer 1B formed thereon and having a specific resistance of 30 Ωcm and a thickness of 10 μm. This MOSFET includes a gate oxide film 4 formed on the surface of the epitaxial layer 1B, a gate electrode 3 formed over the gate oxide film 4 and made of a builtup film (i.e. a polycide film) of an n-type polysilicon film and a tungsten silicide (WSi$_2$) film, an n-type semiconductor region (source) 5 formed in ane epitaxial layer 2, a p$^+$-type semiconductor region (i.e. a source punch-through region) 6, a p-type semiconductor region (a punch-through stopper layer) 7, an n-type semiconductor region (i.e. a drain-offset region) 8, an n-type semiconductor region (drain) 9, a shield conductive film 10 formed over the n-type semiconductor region (the drain-offset region) 8, and a silicon oxide film 11 provided therebelow.

Although not specifically limited to, the length of the gate electrode 3 of the MOSFET (i.e. a gate length) is at 0.5 μm, the length of the n-type semiconductor region (drain-offset region) 8 is at 3.0 μm, the length of the shield conductive film is at 1.0 μm, and the distance between the gate electrode 3 and the shield conductive film 10 is at 0.5 μm. Moreover, the thickness of the gate electrode 3 is at 270 nm, the thickness of the shield conductive film 10 is at 200 nm, the thickness of the gate oxide film 4 is at 50 nm, and the thickness of the silicon oxide film 11 is at 300 nm.

First wirings 13 to 16 are formed over the MOSFET via a silicon oxide film 12. The wiring 13 constitutes a source electrode and is electrically connected to the n-type semiconductor region (source) 5 and the p$^+$-type semiconductor region (i.e. the source punch-through region) 6 via a contact hole 17 formed in the silicon oxide film 12. This wiring 13 is also electrically connected to the shield conductive film 10 via a contact hole 18, which is formed in the silicon oxide film 12 provided over the field oxide film 2 surrounding an active region L.

The wiring 14 constitutes a gate shunt wiring and is electrically connected to the gate electrode 3 via a contact hole 19, which is formed in the silicon oxide film 12 provider over the field oxide film 2. The wiring 15 constitutes a drain electrode and is electrically connected to the n-type semiconductor region (drain) 9 via a contact hole 20 formed in the silicon oxide film 12.

Second wirings 23 to 25 are formed over the wiring 13 to 16 via an interlayer insulating film 22 made of a silicon oxide film. It will be noted that in FIGS. 1 and 3, these wirings 23 to 25 are, respectively, indicated as a shaded pattern. The wiring 23 constitutes a lead wiring for drain and is electrically connected to the first wiring (drain electrode) 15 via a through-hole 26 made in the interlayer insulating film 22. This wiring 23 is constituted integrally with a bonding pad BPd for a drain constituting an external connection terminal.

The wiring 24 constitutes a lead wiring for gate and is electrically connected to the first wiring (gate shunt wiring) 14 via a through-hole 27 made in the interlayer insulating film 22 provided over the field oxide film 2. This wiring 24 is constituted integrally with a bonding pad BPg for a gate constituting an external connection terminal.

The wiring 25 constitutes a lead wiring for source, and part thereof is electrically connected to the first wiring (source electrode) 13 via a through-hole 28 formed in the interlayer insulating film 22. Another part of the wiring 25 is electrically connected to the first wiring 16 via a through-hole 29 formed in the interlayer insulating film 22. The wiring 16 is electrically connected to the silicon substrate 1 via the contact hole 21 and the p$^+$-type semiconductor region (source punch-through region) 6, and are also electrically connected to a source electrode 30 provided at a back side of the silicon substrate 1.

It will be noted that in FIG. 3, four gate electrodes 3 are indicated for conveniences sake and, in fact, several tens of gate electrodes 3 are connected to one bonding pad BPg to make one block and that several blocks are connected in parallel to each other to output great power.

In this way, the power MOSFET for high frequency of this embodiment includes the shield conductive film 10 formed over the n-type semiconductor region (drain-offset region) 8 and set at the same potential as the source, wherein the shield conductive film 10 and other electrode wirings are arranged in such orders of the drain electrode 15, shield conductive film 10, gate electrode 3, source electrode 13 and gate shunt wiring 14.

Next, the effect of forming the shield conductive film 10 in the vicinity of the gate electrode 3 is now described with reference to FIGS. 4 to 6.

Figure 4:
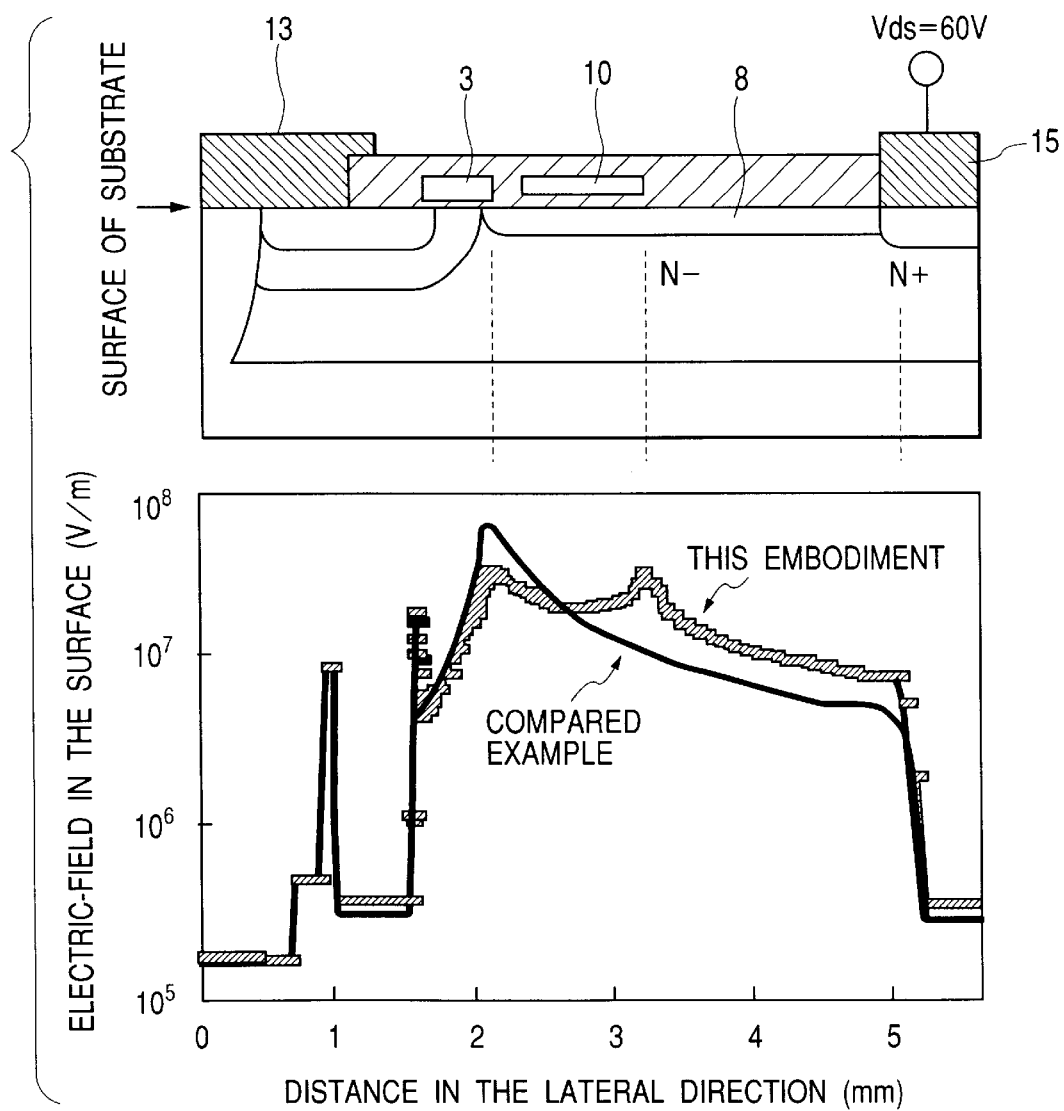
FIG. 4 is a graph showing the distribution of an electric field intensity of power MOSFET according to the embodiment of the invention.

FIG. 4 is a graph showing the distribution of an electric field intensity in the surface of the silicon substrate 1 when a voltage of 60 V is applied to the drain electrode 15 of the MOSFET of this embodiment and the gate electrode 3, shield conductive film 10 and source electrode 13 are grounded. The position in the lateral direction of the abscissa corresponds to the sectional view shown above the graph. For a comparative example, the intensity of an electric field of a MOSFET structure (of the afore-indicated first prior art technique) wherein a source electrode is formed to cover a gate electrode without use of a shield conductive film is shown.

As shown, it will be seen that where the shield conductive film is absent, the electric field concentrates at the end portion of the gate electrode, at which the intensity of the electric field is in a maximum. When the shield conductive film is formed, there appears a peak of the intensity of the electric field at the side end portion of the drain, and the maximal value of the intensity is lower than that of the case where no shield conductive film is provided. In view of this, the MOSFET of this embodiment is effective in improving the drain breakdown voltage and the drain current and is also effective as a measure of suppressing characteristic degradation ascribed to hot carriers.

Figure 5:
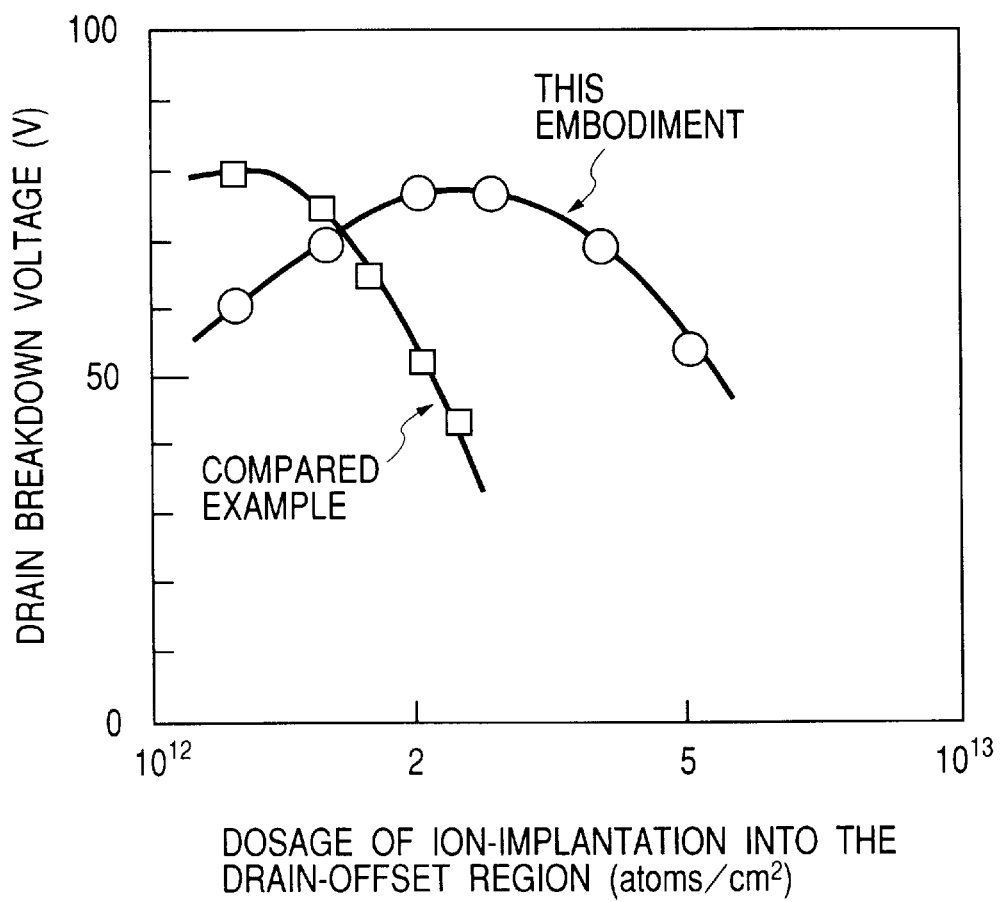
FIG. 5 is a graph showing the relation between the dosage of ion implantation into a drain-offset region and the drain breakdown voltage in power MOSFET according to the embodiment of the invention.

FIG. 5 is a graph showing the relation between the dosage of ion implantation at the drain-offset region 8 and the drain breakdown voltage.

For the high performance of MOSFET, a given drain breakdown voltage is ensured when the dosage of the ion implantation into the drain-offset region is large. More particularly, while keeping a high drain breakdown voltage, one is enabled to reduce the on resistance (Ron) of MOSFET and improve the drain current capacitance.

As shown, where the shield conductive film is provided, such a drain breakdown voltage as in the case where no shield conductive film is formed can be obtained even if the dosage of the ion implantation into the drain-offset region is increased by as much as about two times. In this manner, the resistance of the drain-offset region (Roffset), which is part of the on resistance (Ron) component, is reduced to half, and where a shield conductive film is absent, the on resistance (Ron) of the MOSFET that has been at 26 Ωmm is reduced, by approximately 40%, to 16 Ωmm.

Figure 6:
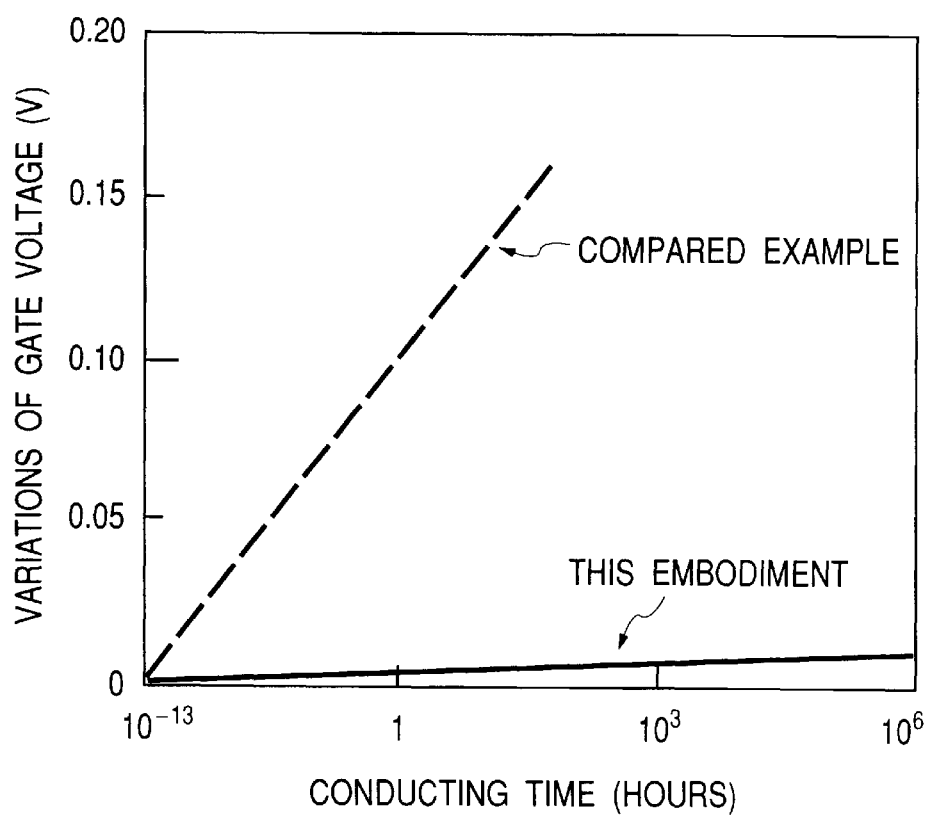
FIG. 6 is a graph showing the relation between the variation of a gate voltage and the voltage application time in power MOSFET according to the embodiment of the invention.

FIG. 6 is a graph showing the relation between the variation of a gate voltage for obtaining a given drain current when a gate voltage of several volts are applied to between the gate and the source and a drain current is passed thereto, followed by allowing to stand over a long time and the voltage application time. The variation of the gate voltage is caused by generation of a fixed potential by injection of hot electrons, generated by passage of the drain current, into the gate electrode and the oxide film in the vicinity of the drain-offset region. In order to suppress the injection of the hot electrons, it is necessary that an electric field be limited at the injection portion.

As shown, where no shield conductive film exists, the degree of variation of the gate voltage after standing for 1 hour, shown as "Comparative Example", was found to be at about 0.1 V. When the shield conductive film is provided, the degree of the variation can be reduced to 1/10 or below for the same time as will be seen from "This Embodiment" in the figure. This is ascribed to the limitation of the intensity of an electric field at the end portion of the gate electrode by the provision of the shield conductive film as shown in the graph of FIG. 4 showing the distribution of the electric field intensity.

Next, the high frequency operations of the MOSFET of this embodiment are described with reference to FIGS. 7 to 9.

Figure 7:
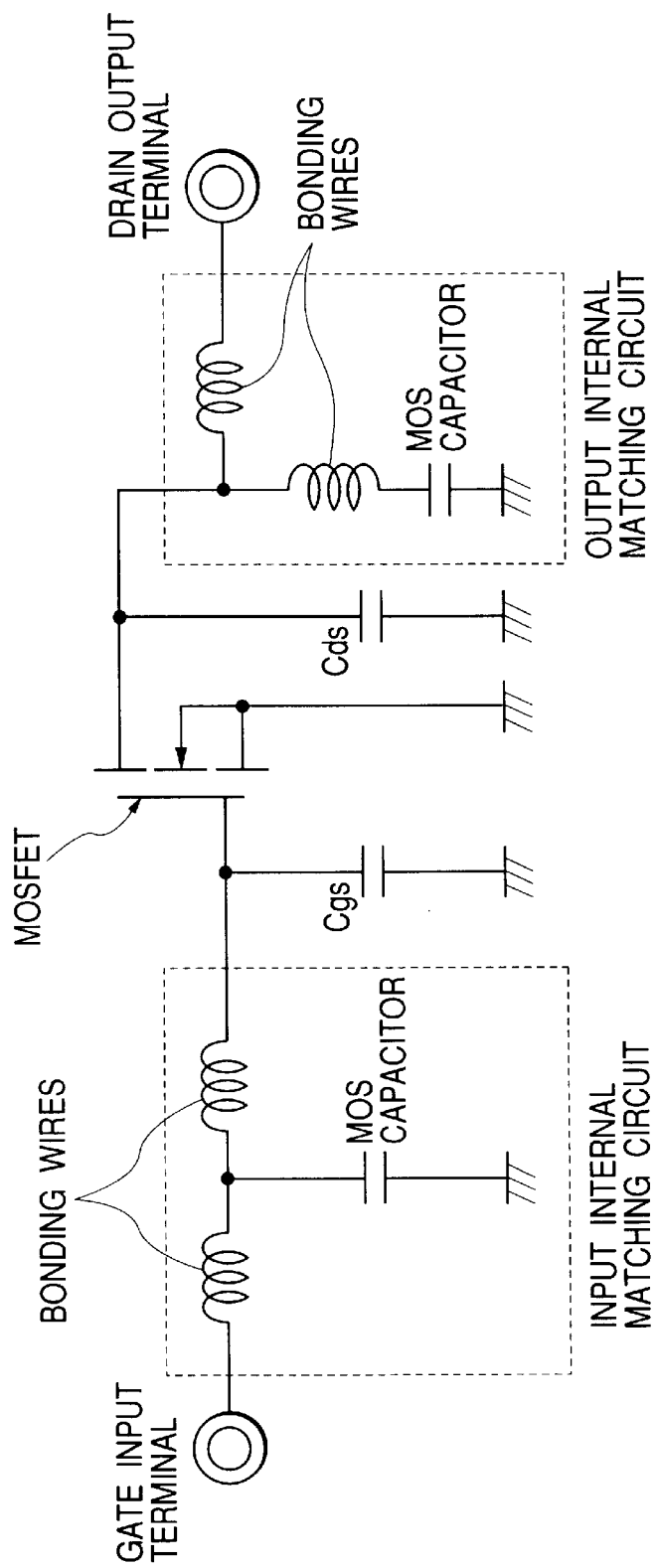
FIG. 7 is an equivalent circuit diagram within a package of an amplifier using power MOSFET according to the embodiment of the invention.

FIG. 7 is an equivalent circuit diagram within a package of a high frequency power amplifier using the MOSFET of the embodiment. This amplifier has an arrangement including an input internal matching circuit and an output matching circuit made of a MOS capacitor and a bonding wire (inductance) connected to input and output of FET having a gate width of 150 mm. The MOSFET has an input capacitance (Cgs) of 112 pF, an output capacitance (Cds) of 42 pF, a feedback capacitance (Cgd) of 1.6 pF and an on resistance of 0.13Ω. Where the operating frequency is at 2.2 GHz, the input and output impedances of the MOSFET obtained from $1/\omega C$ are at 0.71Ω for inputting and at 1.7Ω for outputting. From these values, the impedances are converted by means of the matching circuits to increase the impedances as viewed from the package terminals, thereby permitting the amplifier to be assembled in an external packaging substrate.

Figure 8:
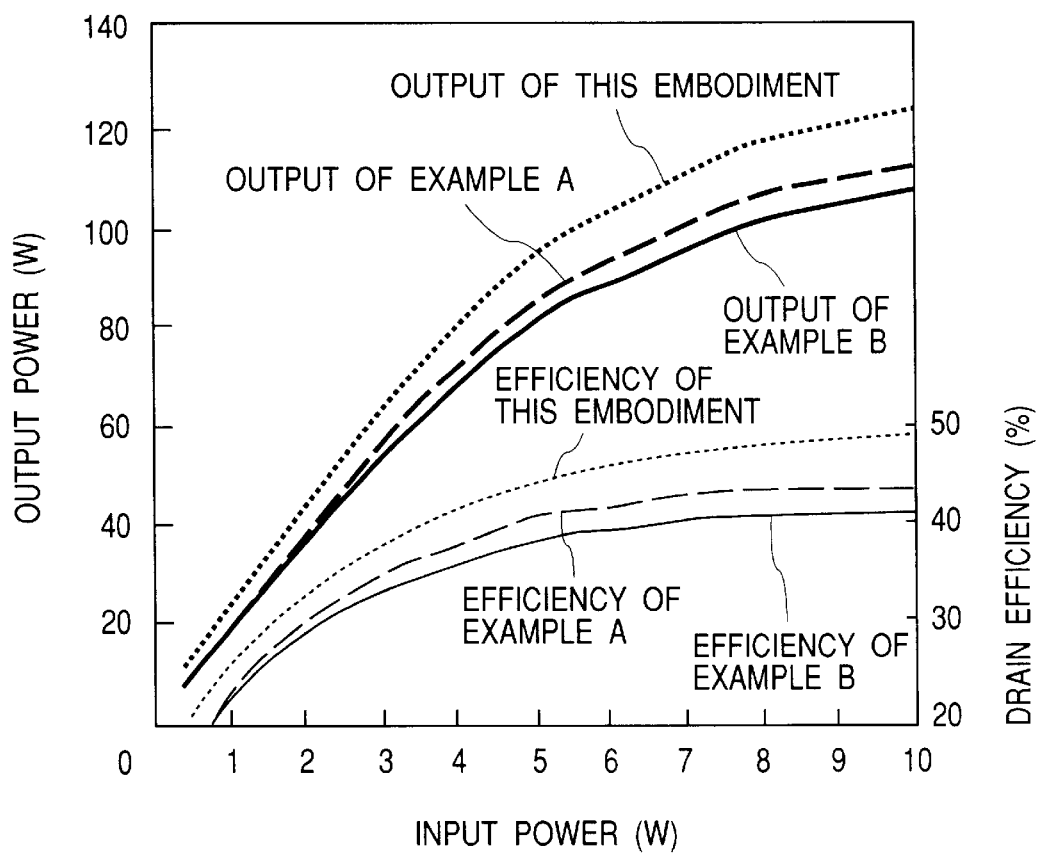
FIG. 8 is a graph showing input and output characteristics in high frequency, large power operation of power MOSFET according to the embodiment of the invention.
Figure 9:
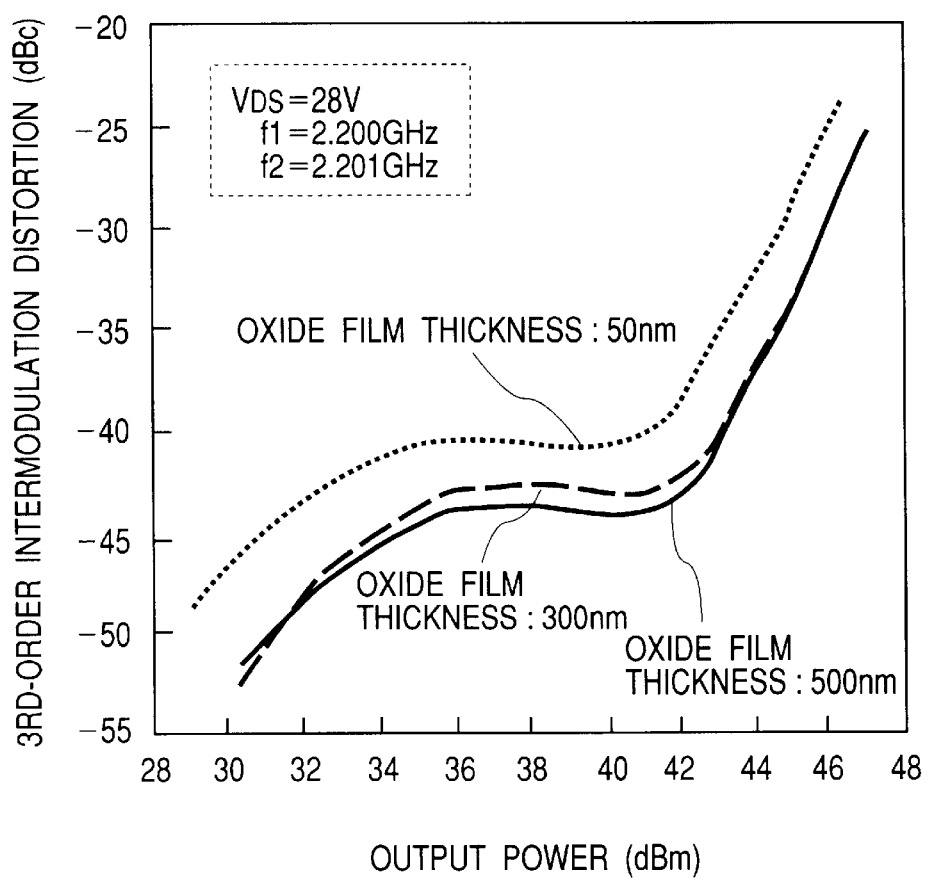
FIG. 9 is a graph showing the relation between the third order intermodulation distortion and the output power of power MOSFET according to the embodiment of the invention.

FIG. 8 is a graph showing the input and output characteristics in the course of high frequency, large power operations of the MOSFET used in FIG. 7. In the figure, assuming application to a base station amplifier of the W-CDMA system, the output power and drain efficiency relative to the input power in case where sine wave signals of 2.2 GHz are inputted to the MOSFET at a power supply voltage of 28 V and a given bias current are, respectively, shown. Two MOSFETs are used and output power is obtained through push-pull operations. For comparative examples, the input and output characteristics of examples A and B are also shown. Example A is directed to a MOSFET structure, which has a shield conductive film but consideration is not taken to the increases of input and output capacitances with respect to the thickness and position of the shield conductive film and also to the position of a gate shunt wiring, and example B is directed to a MOSFET structure, which has no shield conductive film and a source electrode is formed to cover a gate electrode therewith.

As shown in the figure, the MOSFET of this embodiment is improved over examples A, B by 10 W or over for the output power and 5% or over for the drain efficiency when input power is set at 10 W. The reason for this is that the input and output capacitances of example A are larger by approximately 20% than those of this embodiment, thus leading to a corresponding reduction of impedance. Thus, a loss in the matching circuits in the package becomes considerable. As for example B, since no shield conductive film is used, the impurity concentration in the drain-offset region cannot be increased in view of the necessity for limiting an electric field, so that the on resistance and drain current cannot be improved, thereby not permitting the performance to be improved. In example B, the gate shunt wiring is not possible, so that the gate width (finger width) of each gate electrode is decreased so as to allow the gate resistance to be negligible. In this case, although the gate resistance decreases, the number of the fingers increases wholly as a chip, under which other parasitic capacitances increase, which is one of factors of causing the performance to be lowered. In contrast, with the layout of this embodiment, the gate shunt wiring can be adequately kept away from the drain, source electrode and shield conductive film, and one is enabled to reduce the gate resistance while suppressing the parasitic capacitances, thereby ensuring a satisfactory gain at a high frequency.

In a great power operation test of FIG. 8, the linear amplification characteristics of the MOSFET of the embodiment are evaluated, with the results being described with reference to FIG. 9.

For application to the base station of the W-CDMA system, it is required that the amplifier keep its linearity at great output power. For a measure as to whether or not the linear amplification characteristic is good or not, two waves having a narrow interval between frequencies are inputted, and an intermodulation distortion, which is a parameter ascribed to the extension of frequency spectra of the resultant output signals, was evaluated. In the figure, there is shown the relation between the third order intermodulation distortion and the output power when input power with a frequency of 2.2 GHz and 2.201 GHz is added for an input of the MOSFET. The thickness of the insulating film beneath the shield conductive film is set at 500 nm, 300 nm and 50 nm as a parameter. When an intended value of the third order intermodulation distortion is at −30 dBc or below, the maximal value of output power capable of achieving the requirement is lowered to 46 dBm (about 40 W) for the insulating film thicknesses of 500 nm and 300 nm and also to 45 dBm (about 32 W) for the thickness of 50 nm. This is due to the fact that the thickness of the insulating film beneath the shield conductive film is made as thin as 50 nm that is equal to that of the gate oxide film, so that the electrostatic capacitance between the shield conductive film and the drain-offset region appears to be abruptly great in case where a drain voltage is low, and a parasitic output capacitance is thus added to, thus leading to the deterioration of the distortion owing to the great mismatching with the matching circuit. With such a thickness as mentioned above, an electric field is concentrated at the end portion of the shield conductive film, with the attendant problem that the resultant drain breakdown voltage becomes low. On the other hand, any significant difference between the thicknesses of 300 nm and 500 nm is not recognized, but when the thickness is set at 500 nm, the insulating film is so thick that the features illustrated with reference to FIGS. 4 to 6 cannot be brought out satisfactorily and are optimal in the vicinity of 300 nm.

Next, the method for fabricating MOSFET according to this embodiment is now described with reference to FIGS. 10 to 18.

Figure 10:
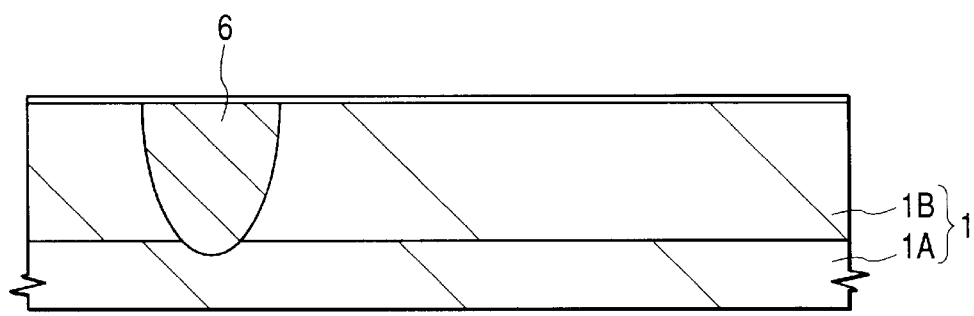
FIG. 10 is a sectional view of an essential part showing one step in a method for fabricating power MOSFET according to an embodiment of the invention.

Initially, as shown in FIG. 10, a silicon substrate 1, in which a p-type epitaxial layer 1B is grown on a support substrate 1A made of p-type single crystal silicon, is provided, and boron is ion implanted into the silicon substrate 1 through a mask of a photoresist film (not shown) to form a p⁺-type semiconductor region (i.e. a source punch-through region) 6 whose bottom reaches the support substrate 1A.

Figure 11:
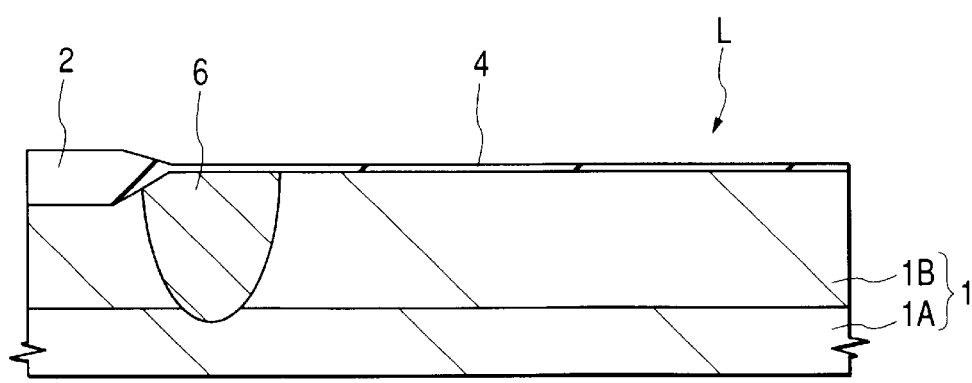
FIG. 11 is a sectional view of an essential part showing another step in the method according to the embodiment of the invention.

Next, as shown in FIG. 11, a field oxide film 2 is formed at an element isolation region of the silicon substrate 1 according to a known LOCOS method, after which a gate oxide film 4 is formed on the surface of the silicon substrate 1 at an active region L surrounded with the filed oxide film 2 therearound.

Figure 12:
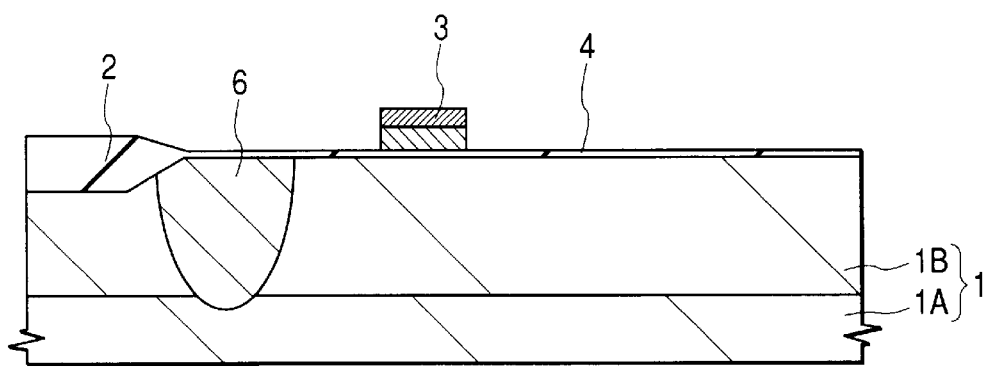
FIG. 12 is a sectional view of an essential part showing a further step in the method for fabricating power MOSFET according to the embodiment of the invention.

Subsequently, as shown in FIG. 12, a gate electrode 3 is formed over the gate oxide film 4. For the formation of the gate electrode 3, a 100 nm thick n-type polysilicon film is deposited over the gate oxide film 4 by a CVD method, and a 170 nm thick tungsten silicide film is further deposited over the polysilicon film by a sputtering method, followed by patterning these films by dry etching through a photoresist film as a mask.

Figure 13:
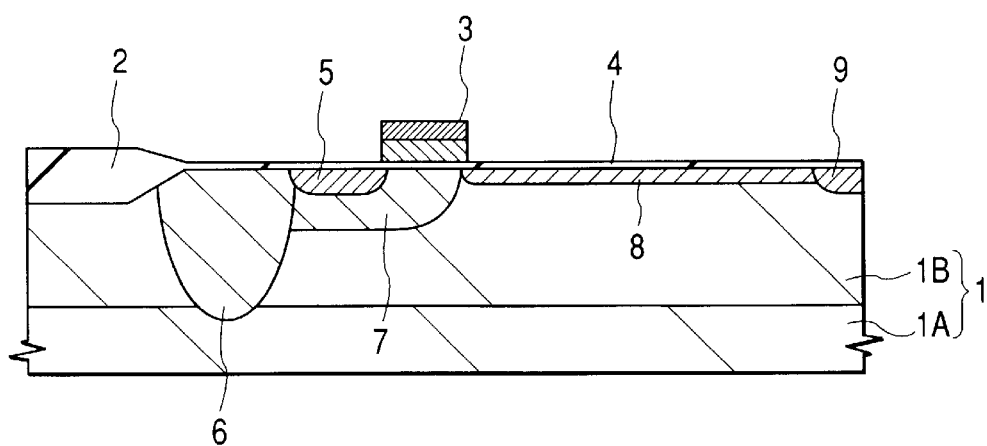
FIG. 13 is a sectional view of an essential part showing a still further step in the method for fabricating power MOSFET according to the embodiment of the invention.

As shown in FIG. 13, boron and phosphorus are ion implanted into the silicon substrate 1 through a photoresist film as a mask, thereby forming a p-type semiconductor region (i.e. a punch-through stopper region) 7, an n-type semiconductor region (i.e. a drain-offset layer) 8, an n-type semiconductor region (source) 5 and an n-type semiconductor region (drain) 9. The p-type semiconductor region (punch-through stopper layer) 7 may be formed prior to the step of forming the gate electrode 3.

Figure 14:
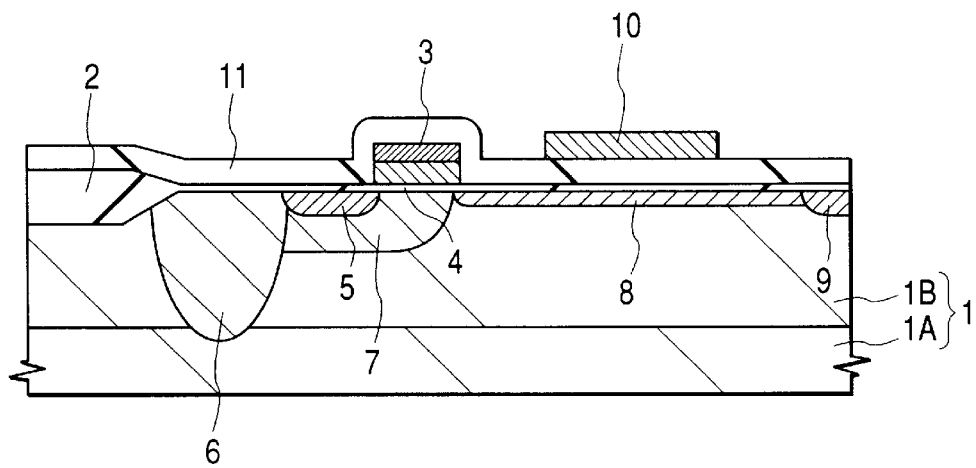
FIG. 14 is a sectional view of an essential part showing another step in the method for fabricating power MOSFET according to the embodiment of the invention.

Next, as shown in FIG. 14, a 300 nm thick silicon oxide film 11 is deposited over the silicon substrate 1 by a CVD method, after which a shield conductive film 10 is formed over the silicon oxide film 11. For the formation of the shield conductive film 10, an n-type polysilicon film having a thickness (e.g. a thickness of approximately 200 nm) smaller than the gate electrode 3 by a CVD method is deposited on the silicon oxide film 11, after which the polysilicon film is subjected to patterning by dry etching through a mask of a photoresist film.

Figure 15:
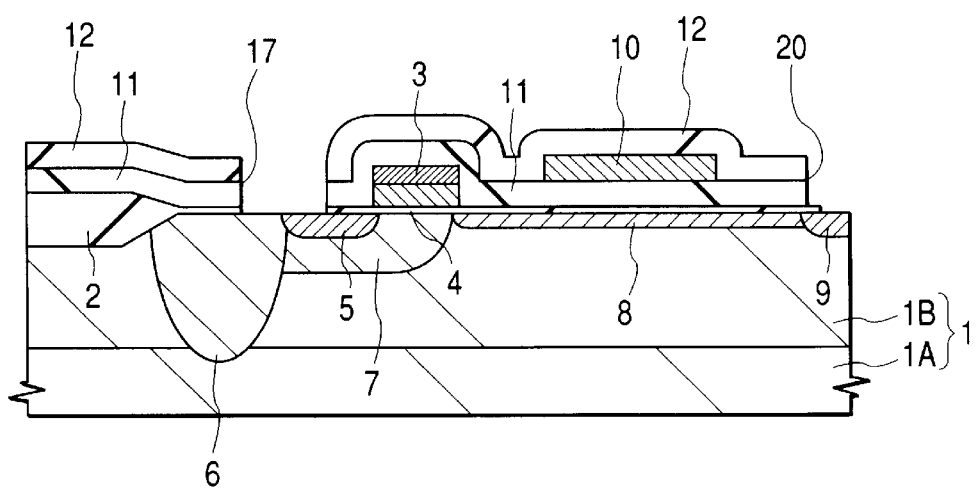
FIG. 15 is a sectional view of an essential part showing still another step in the method for fabricating power MOSFET according to the embodiment of the invention.
Figure 16:
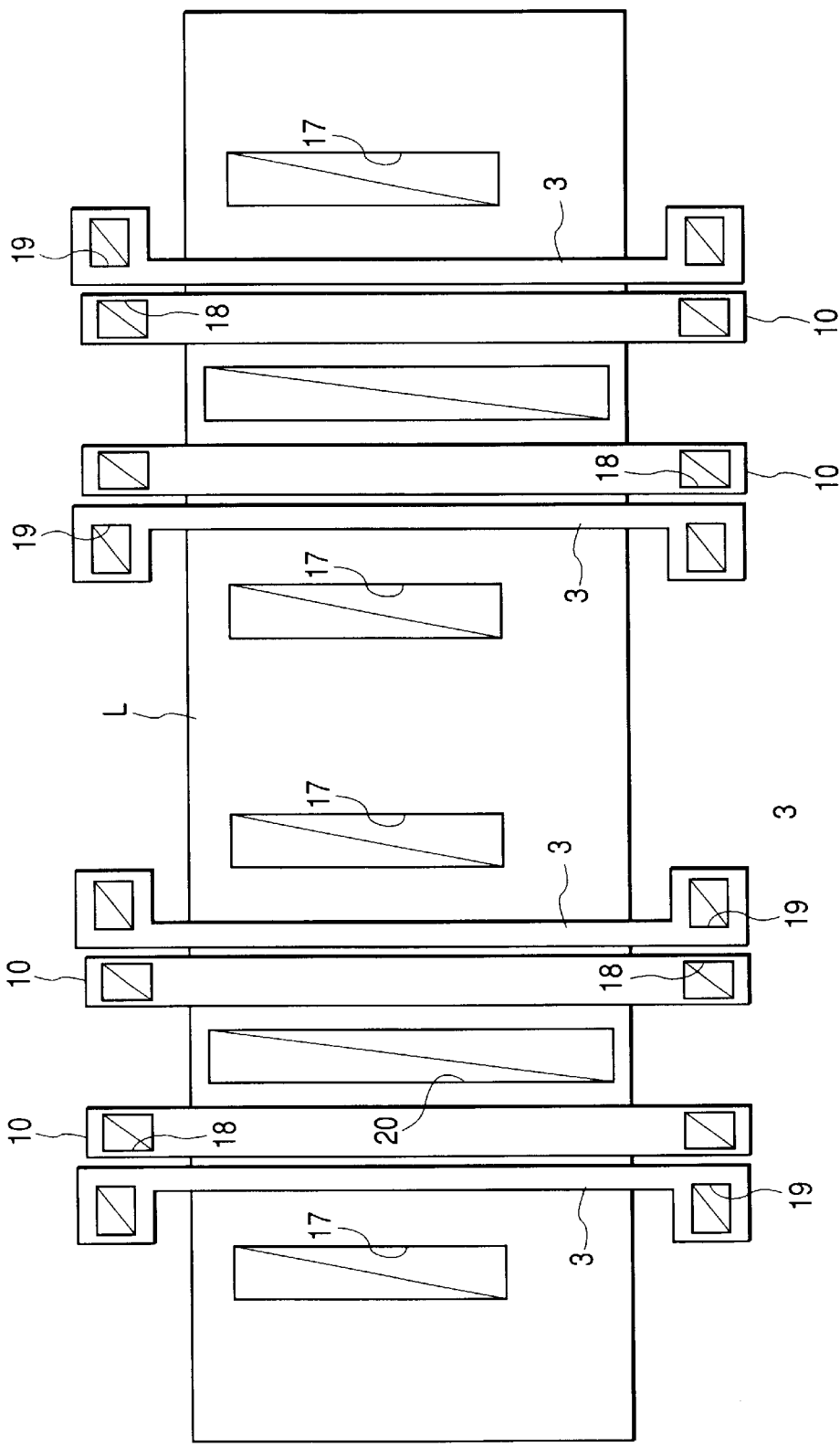
FIG. 16 is a sectional view of an essential part showing yet another step in the method for fabricating power MOSFET according to the embodiment of the invention.

Thereafter, as shown in FIGS. 15 an 16, a silicon oxide film 12 having a thickness of about 300 nm to 500 nm is deposited over the silicon substrate 1 by a CVD method, after which the silicon oxide film 12 and the silicon oxide film 11 are, respectively, dry-etched through a mask of a photoresist film to form contact holes 17 to 20.

Figure 17:
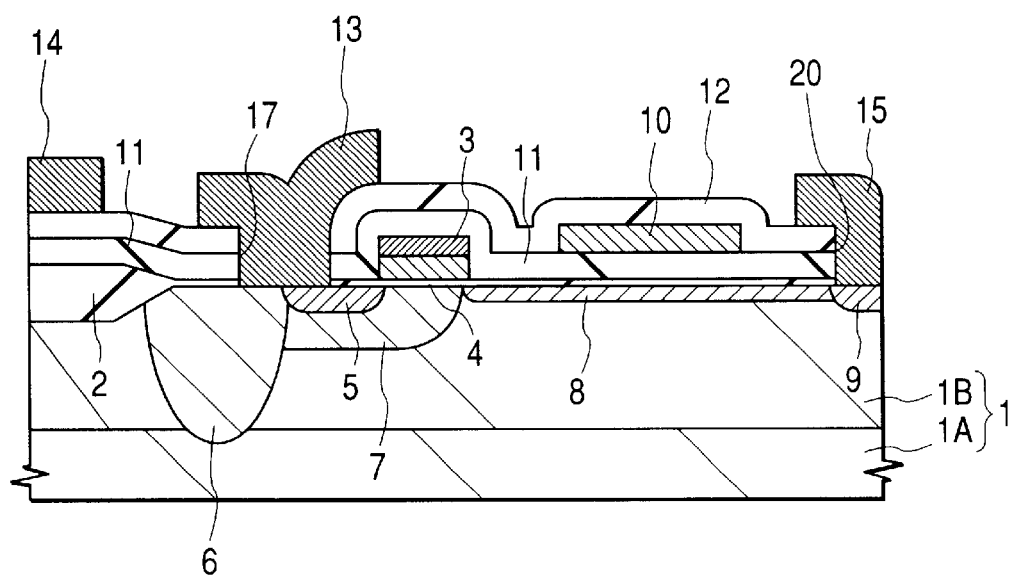
FIG. 17 is a sectional view of an essential part showing another step in the method for fabricating power MOSFET according to the embodiment of the invention.

As shown in FIGS. 17 and 18, an approximately 800 nm thick Al (aluminium) alloy film is deposited over the silicon oxide film 12 by a sputtering method, followed by patterning the Al alloy film by dry etching through a mask of a photoresist film to form a wiring (source electrode) 13, a wiring (a gate shunt wiring) 14 and a wiring (drain electrode) 15.

Thereafter, an interlayer insulating film 22 is formed over the silicon oxide film and is subsequently subjected to dry etching to form through-holes 26 to 29. Thereafter, an Al alloy film having a thickness of approximately 1200 nm deposited over the interlayer insulating film 22 by the sputtering method is subjected to patterning to form second-layered wirings 23 to 25, followed by forming a source electrode 30 on a back side of the silicon substrate 1 to obtain power MOSFET shown in FIGS. 1 to 3. It will be noted that if the current capacitances of the wirings and the freedom of a layout are necessary, three or more wiring layers may be formed.

In this manner, the power MOSFET of this embodiment has such an arrangement that the shield conductive film 10 provided over the drain-offset region 8 is formed in a thickness smaller than the gate electrode 3. In doing so, the capacitance (Cgs) between the side wall of the shield conductive film 10 and the side wall of the gate electrode 3 and the capacitance (Cds) between the side wall of the shield conductive film 10 and the drain electrode 15 can be made small, respectively.

The shield conductive film 10 and the drain-offset region 8 can be separated from each other through the two insulating films (i.e. the gate oxide film 4 and the silicon oxide film 11) so that when compared with the case where the shield conductive film 10 is formed on the gate oxide film 4, the capacitance between the drain and the source can be made smaller.

Thus, the input and output capacitances (Cgs, Cds) of the MOSFET can be made small, and MOSFET that ensures high output power and good high frequency characteristics can be realized.

The embodiments of the invention have been particularly described, which should not be construed as limiting the invention thereto, and various variations maybe possible without departing from the spirit of the invention.

The effects attained by typical embodiments of the invention can be summarized below.

According to the invention, while ensuring the reliability of MOSFET for power amplification usable in base station systems for portable telephone such as GSM, PCS, PDC and W-CDMA systems, output power characteristics and high frequency characteristics can be improved.

What is claimed is:

1. A semiconductor device including an insulated gate type field effect transistor, said insulated gate type field effect transistor comprising:

a semiconductor substrate having a first main surface and a second main surface opposing to each other, said first main surface having a semiconductor region of a first conductivity type;

a gate electrode made of a first conductive film formed via a gate insulating film over a channel forming region in said first main surface of said semiconductor substrate;

a source semiconductor region of a second conductivity type formed at one end side of said gate electrode and formed in the semiconductor region of the first conductivity type at the first main surface of said semiconductor substrate;

a drain semiconductor region of a second conductivity type formed at the other end side of said gate electrode opposite to said one end side and kept away from said gate electrode, and formed in the semiconductor region of the first conductivity type at the first main surface of said semiconductor substrate;

a drain-offset semiconductor region of a second conductivity type formed at the other end side of said gate electrode, formed in the semiconductor region of the first conductivity type at the first main surface located between said gate electrode and said drain semiconductor region;

a shield conductive film made of a second conductive film and formed over a surface of said drain-offset semiconductor region through an insulating film, said shield conductive film being electrically connected to said source semiconductor region;

a second insulating film covering said source and drain semiconductor regions and said shield conductive film, said second insulating film having contact holes on said source and drain semiconductor regions and said shield conductive film;

a source electrode made of a first metal film which is formed on said second insulating film and electrically connected to said source semiconductor region via the contact hole;

a drain electrode made of the first metal film which is formed on said second insulating film and electrically connected to said drain semiconductor region via the contact hole;

a first wiring made of the first metal film which is formed on said second insulating film and electrically, connects said source semiconductor region and said shield conductive film in common via the contact holes; and a gate shunt wiring of the first metal film formed on said second insulating film for providing an electric shunt between two end portions of said gate electrode which are located apart from each other, said gate electrode and said gate shunt wiring being electrically connected via parts of said gate shunt wiring formed in contact holes passing through said first insulating film and said second insulating film, wherein the second conductive film constituting said shield conductive film has a thickness smaller than said first conductive film constituting said gate electrode, and wherein said insulating film for covering said drain-offset semiconductor region and underlying said shield conductive film comprises a lower film constituted of said gate insulating film and an upper film of a first insulating film.

2. A semiconductor device according to claim 1, wherein said semiconductor substrate includes a support substrate made of a semiconductor material of the first conductivity type and an epitaxial layer formed on said support substrate and made of a semiconductor material of the first conductivity type, the first main surface of said semiconductor substrate being constituted of said epitaxial layer, the second main surface of said semiconductor substrate being constituted of said support substrate.

3. A semiconductor device according to claim 2, further comprising:

a source punch-through region which is formed in said epitaxial layer, electrically connected to said source semiconductor region and said support substrate, and is made of a semiconductor material of a first conductivity type; and a source electrode of a conductive material formed on said second main surface of said support substrate.

4. A semiconductor device according to claim 1, wherein the second conductive film constituting said shield conductive film is thinner than the first metal film forming said drain electrode.

5. A semiconductor device comprising the insulated gate type field effect transistor defined in claim 1, and a high frequency amplification circuit having an input internal matching circuit constituted of a first capacitor and a first inductance, and an output matching circuit constituted of a second capacitor and a second inductance.

6. A semiconductor device including an insulated gate type field effect transistor, said insulated gate-type filed effect transistor comprising:

a semiconductor substrate having a first main surface and a second main surface opposing to each other, said first main surface having a semiconductor region of a first conductivity type;

a gate electrode made of a first conductive film that is formed via a gate insulating film over a channel forming region in said first main surface of said first conductivity type semiconductor region;

a source semiconductor region of a second conductivity type formed at one end side of said gate electrode and formed in the semiconductor region of the first conductivity type at the first main surface of said semiconductor substrate;

a drain semiconductor region of the second conductivity type formed at the other end side of said gate electrode opposite to said one end side and kept away from said gate electrode, and formed in the semiconductor region of the first conductivity type at the first main surface of said semiconductor substrate;

a drain-offset semiconductor region of the second conductivity type formed at the other end side of said gate electrode, and formed in the semiconductor region of the first conductivity type at the first main surface located between said gate electrode and said drain semiconductor region;

a shield conductive film made of a second conductive film and formed over a surface of said drain-offset semiconductor region through an insulating film;

a gate shunt wiring made of a first metal layer for providing an electric shunt between two end portions of said gate electrode kept away from each other;

a source electrode made of a first metal film and electrically connected with said source semiconductor region; and a drain electrode made of the first metal film and electrically connected with said drain semiconductor region, wherein in a planar layout of said insulated gate type field effect transistor formed at the first main surface of said semiconductor substrate, said drain electrode, said shield conductive film, said gate electrode, said source electrode and said gate shunt wiring are arranged in this order and individually have portions extending parallel to one another.

7. A semiconductor device according to claim 6, wherein said second conductive film constituting said shield conductive film has a thickness smaller than said first conductive film constituting said gate electrode.

8. A semiconductor device according to claim 6, wherein said insulating film covering said drain-offset semiconductor region and underlying said shield conductive film is made of a lower film constituted of said gate insulating film and an upper film of said first insulating film formed on said lower film.

9. A semiconductor device according to claim 6, wherein said insulated gate type field effect transistor function as an amplification element of a high frequency power amplifier whose working frequency ranges from 800 MHz to 2.5 GHz.

10. A semiconductor device comprising the insulated gate type field effect transistor defined in claim 6, and a high frequency amplification circuit having an input internal matching circuit constituted of a first capacitor and a first inductance, and an output matching circuit constituted of a second capacitor and a second inductance.

* * * * *